(12) United States Patent
Phogat et al.

(10) Patent No.: US 11,316,420 B2
(45) Date of Patent: Apr. 26, 2022

(54) ADAPTIVE BIAS CONTROL FOR A VOLTAGE REGULATOR

(71) Applicant: TEXAS INSTRUMENTS INCORPORATED, Dallas, TX (US)

(72) Inventors: Rohit Phogat, Bengaluru (IN); Ramakrishna Ankamreddi, Bengaluru (IN); Isha Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/124,599

(22) Filed: Dec. 17, 2020

(65) Prior Publication Data
US 2021/0194346 A1   Jun. 24, 2021

(30) Foreign Application Priority Data
Dec. 20, 2019 (IN) .............................. 201941053100

(51) Int. Cl.
*H02M 1/088* (2006.01)
*H03K 17/687* (2006.01)

(52) U.S. Cl.
CPC ........ *H02M 1/088* (2013.01); *H03K 17/6872* (2013.01)

(58) Field of Classification Search
CPC ........ H02M 1/00; H02M 1/088; H03K 17/00; H03K 17/04126; H03K 17/063; H03K 17/0826; H03K 17/601; H03K 17/6872; H03K 2217/00; H03K 2217/0036
USPC ....................................................... 327/109
See application file for complete search history.

(56) References Cited

U.S. PATENT DOCUMENTS

| 8,547,077 B1 | 10/2013 | Chang |
| 2010/0164451 A1* | 7/2010 | Cerchi ................... G05F 1/565 323/282 |
| 2014/0117958 A1 | 5/2014 | Price et al. |
| 2016/0173098 A1* | 6/2016 | Jaffari ............ H03K 19/018528 326/83 |

FOREIGN PATENT DOCUMENTS

| CN | 104460807 A | 3/2015 |
| CN | 110120788 A | 8/2019 |

OTHER PUBLICATIONS

International Search Report for Application No. 2020066311, dated Mar. 26, 2021 (8 pages), US.

* cited by examiner

*Primary Examiner* — Menatoallah Youssef
*Assistant Examiner* — Dave Mattison
(74) *Attorney, Agent, or Firm* — Mark Allen Valetti; Charles A. Brill; Frank D. Cimino

(57) ABSTRACT

A circuit includes first and second transistors, an adaptive bias current source circuit, and an adaptive resistance circuit. The first transistor has a control terminal and first and second current terminals. The control terminal of the first transistor being a first input to the circuit. The second transistor has a control terminal and first and second current terminals, and the control terminal of the second transistor is a second input to the circuit. The first and second inputs are differential inputs to the circuit. The adaptive bias current source circuit is coupled to the second current terminal of the first transistor. The adaptive resistance circuit is coupled between the second current terminal of the second transistor and the adaptive bias current source circuit.

13 Claims, 5 Drawing Sheets

ADAPTIVE BIAS CONTROL FOR A VOLTAGE REGULATOR

CROSS-REFERENCE TO RELATED APPLICATION

This application claims priority to India Provisional Application 201941053100 filed Dec. 20, 2019, titled "A High-Gain Adaptive Bias Control For Ultra-Low IQ, High-Performance Voltage Regulators," which is hereby incorporated by reference in its entirety.

BACKGROUND

A voltage regulator regulates an output voltage using an input voltage that may be any voltage within a specified range. Performance parameters pertaining to a voltage regulator include the no-load quiescent current, transient response, noise, and power supply rejection ratio (PSRR). Quiescent current is the current that flows through the voltage regulator to ground irrespective of any load current that may be present (or no load current). Transient response measures the amount of time the voltage regulator takes to react to a sudden change in load current and again produce a regulated output voltage, Noise can be superimposed on the regulated output voltage, Noise can be produced from a variety of sources within the voltage regulator or even from the input voltage itself. PSRR describes the capability of the voltage regulator to suppress any power supply variations to its output signal. PSRR may be defined as the ratio of the change in the output voltage from the voltage regulator to the change in the regulator's supply voltage. Generally, higher performance voltage regulators are characterized by lower no-load quiescent current, faster transient response, lower noise and higher PSRR across a wide range of load currents.

SUMMARY

In at least one example, a circuit includes first and second transistors, an adaptive bias current source circuit, and an adaptive resistance circuit. The first transistor has a control terminal and first and second current terminals. The control terminal of the first transistor being a first input to the circuit. The second transistor has a control terminal and first and second current terminals, and the control terminal of the second transistor is a second input to the circuit. The first and second inputs are differential inputs to the circuit. The adaptive bias current source circuit is coupled to the second current terminal of the first transistor. The adaptive resistance circuit is coupled between the second current terminal of the second transistor and the adaptive bias current source circuit.

BRIEF DESCRIPTION OF THE DRAWINGS

For a detailed description of various examples, reference will now be made to the accompanying drawings in which.

Similar reference numbers or other feature designations are used to show the same or similar features.

DETAILED DESCRIPTION

Figure 1:
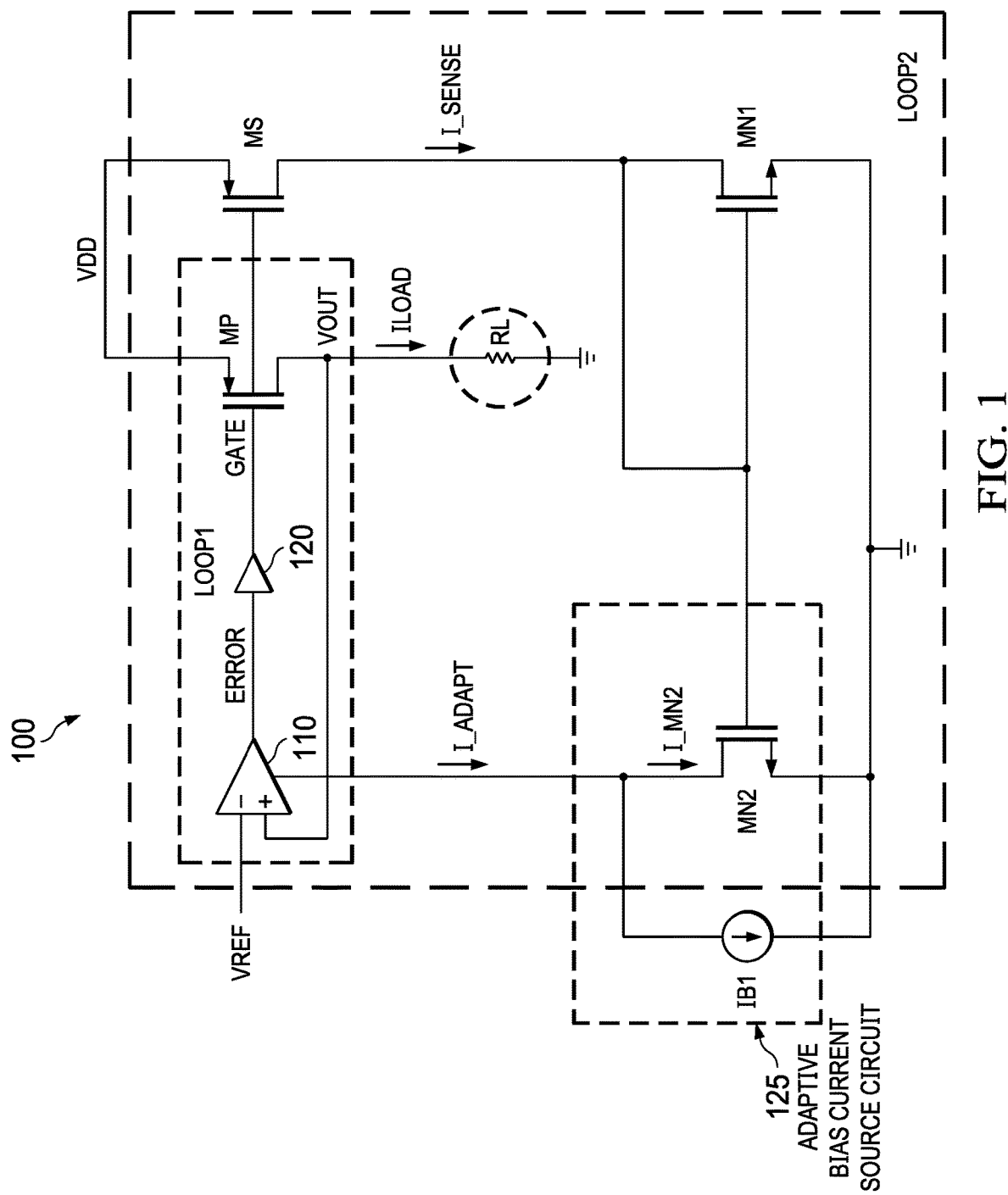
FIG. 1 shows an example of a voltage regulator that includes an error amplifier and that employs adaptive bias current.

FIG. 1 shows one example of a voltage regulator 100. The voltage regulator 100 in this example is a low dropout (LDO) regulator that includes an error amplifier 110 that employs adaptive bias current. The principles described herein may pertain to other types of adaptive bias current-based voltage regulators.

Voltage regulator 100 in the example of FIG. 1 includes the error amplifier 110, a buffer 120, a pass field effect transistor (FET) MP, a sense FET (MS), transistor MN1 and an adaptive bias current source circuit 125. The adaptive bias current source circuit 125 includes transistor MN2 and a current source IB1 (IB1 refers to both the current source device as well as the magnitude of its current). The resistance RL is the resistance of a load that is powered by the voltage regulator 100. The error amplifier 110 includes a negative (−) input (also referred to as the inverting input) and a positive (+) input (also referred to as the non-inverting input). A reference voltage (VREF) is provided to the negative input. The output voltage (VOUT) of the voltage regulator 100 is coupled to the positive input. The error amplifier 110 amplifies the difference between VOUT and VREF to produce an output signal, ERROR. The output of the error amplifier 110 is coupled to an input of buffer 120. As such, ERROR signal is provided to the buffer 120. The buffer 120 generates a gate voltage (GATE) based on ERROR signal to drive the gate of transistor MP. The buffer 120 provides sufficient drive potential to drive the gate of MP and may provide voltage scaling to produce GATE at a different (but proportional) voltage than ERROR.

In this example, transistors MP and MS are p-type metal oxide semiconductor field effect transistors (PMOS transistors). In other implementations, MP and MS are implemented as n-type metal oxide semiconductor field effect transistors (NMOS) transistors with little or no additional modification to voltage regulator 100. The sources of transistors MP and MS are connected together and to voltage supply (VDD). Through buffer 120, ERROR signal thus controls the gate-to-source voltage (Vgs) of transistors MP and MS. Because transistors MP and MS are PMOS transistors in this example, as ERROR signal decreases, the Vgs of both transistors MP and MS increase thereby causing an increase in the drain currents through transistors MP and MS. Conversely, as ERROR signal increases, the Vgs of both transistors MP and MS decrease thereby causing a decrease in the drain currents through transistors MP and MS. The drain current of transistor MP is substantially equal to the current to the load (ILOAD), and the drain current of transistor MS is equal to the sense current (ISENSE). The size of transistor MS (size being the ratio of channel width, W, to channel length, L) may be smaller than the size of transistor MP. As such and because the Vgs of both transistors is the same, ISENSE is proportional to but smaller than ILOAD. ISENSE is thus a scaled down version of ILOAD and is used to control the bias current of the error amplifier 110.

Transistors MN1 and MN2 form a current mirror. Transistors MN1 and MN2 in this example are NMOS transistors. The drain of transistor MN1 is coupled to the drain of transistor MS as well as to the gate of transistor MN1. The gates of transistors MN1 and MN2 are coupled together. The sources of transistors MN1 and MN2 are coupled together and to the ground terminal. In one example, the size of transistor MN1 is equal to the size of transistor MN2. As such, the drain current (I_MN2) through transistor MN2 is equal to ISENSE. Current source IB1 is coupled in parallel with transistor MN2. The bias current I_ADAPT of the error amplifier 110 is the sum of IB1 and I_MN2. IB1 is a fixed current and I_MN2 is a function of the load current, ILOAD. As ILOAD increases, I_MN2 increases, and as ILOAD decreases, I_MN2 will correspondingly decrease. Because I_ADAPT is a function of I_MN2, I_ADAPT is a function of ILOAD. As such, the bias current of the error amplifier 110 is a function of the load current. In this way, the error amplifier's bias current, I_ADAPT, is adaptive based on the magnitude of the load current. IB1 ensures that, even if at no-load current (ISENSE is 0 A), the bias current I_ADAPT of the error amplifier 110 is at least IB1—that is that there is always at least a minimum level of bias current for the error amplifier 110.

Increasing the bias current of the error amplifier 110 for higher load currents achieves a faster transient response, lower noise, and higher PSRR. At low levels of load current or no-load current, reducing the bias current advantageously reduces the quiescent current of the error amplifier.

The voltage regulator 110 includes two control loops—Loop1 and Loop2. Loop1 includes the error amplifier 110 amplifying the difference between VOUT and VREF to produce the ERROR signal to thereby control the Vgs of MP1. For example, if VOUT were to increase, the error amplifier 110 responds by increasing ERROR signal which results in a reduction of the Vgs of transistor MP. Reducing the Vgs of transistor MP causes a decrease in ILOAD, and a reduction in ILOAD causes VOUT to decrease. The opposite happens if ILOAD were to increase (ERROR signal becomes smaller, Vgs of transistor MP becomes larger, and (LOAD increases). Per Loop1, the Vgs of transistor MP is controlled by varying the voltage magnitude of ERROR signal so as to maintain VOUT equal (or approximately equal) to VREF.

Loop2 controls the bias current (I_ADAPT) of the error amplifier. Loop2 includes the generation of ISENSE by MS and mirroring ISENSE via the current mirror of MN1 and MN2. As ILOAD increases, ISENSE also increases, which causes an increase in I_ADAPT. Conversely, if ILOAD decreases, ISENSE decreases, and I_ADAPT also decreases. The gain of Loop2 is a function of the gain (gm) of transistor MN2, the common mode rejection ratio (CMRR) of the error amplifier 110, the gain of buffer 120, the sense ratio between transistors MP and MS (i.e., the size of transistor MS divided by the size of transistor MP), and the gain (gm) of transistor MN1.

Figure 2:
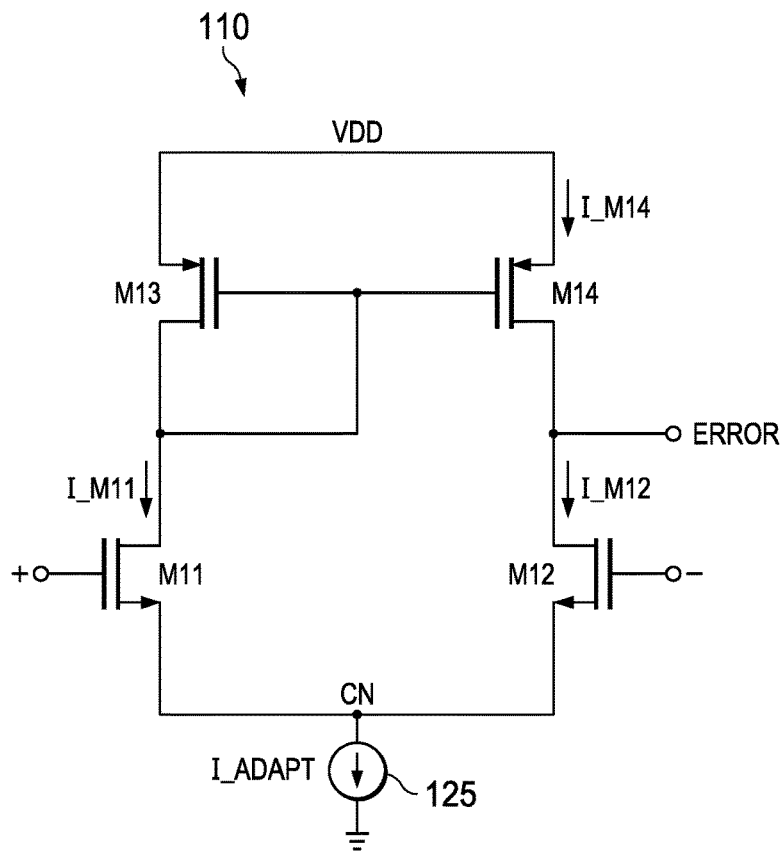
FIG. 2 illustrates an example implementation of the error amplifier.

FIG. 2 is an example of at least a portion of error amplifier 110. The error amplifier 110 in this example includes a differential input pair of transistors M11 and M12 and a current mirror formed by transistors M13 and M14. In this example, transistors M11 and M12 are NMOS transistors and transistors M13 and M14 are PMOS transistors. The gate of transistor M11 is the positive input of the error amplifier and the gate of transistor M12 is the negative input. The sources of transistors M11 and M12 are coupled together at a common node (CN). The adaptive bias current source is shown in symbolic form as I_ADAPT. A portion of I_ADAPT flows through transistor M11 and the remaining portion of I_ADAPT flows through M12. Transistor M13 couples to the drain of transistor M11 and transistor M14 couples to the drain of transistor M12. The gates of transistors M13 and M14 are coupled together and to the drains of transistors M11 and M13.

The drains of transistors M12 and M14 provide the output ERROR signal from the error amplifier 110. If the voltage on the gate of transistor M11 (positive input) increases above the voltage on the gate of transistor M12 (negative input), the Vgs of M11 becomes larger than the Vgs of transistor M12 and a greater percentage of the adaptive bias current, I_ADAP), flows through M11 (shown as I_M11) than through transistor M12. The bias current that flows through transistor M11 also flows through transistor M13 and is mirrored through transistor M14 as well (and shown as I_M14). The current through transistor M12 is designated as I_M12 and is a function of the Vgs of transistor M12. Because the Vgs of M12 is smaller than the Vgs of M11, I_M12 is smaller than I_M11. Due to the current mirror of transistors M13 and M14, I_M12 also is smaller than I_M14. I_M14 being larger than I_M12 causes the drain-to-source voltage (Vds) of transistor M14 to decrease thereby increasing ERROR signal towards VDD. The opposite occurs if the voltage on the gate of transistor M12 increases above the voltage on the gate of transistor M11 resulting the Vds of transistor M14 increasing thereby causing a decrease in ERROR signal.

Ideally, the sizes and threshold voltages of transistors M11 and M12 are identical and thus for equal voltages on the gates of transistors M11 and M12, the bias current, I_ADAPT, divides evenly between I_M11 and I_M12. However, in practice, transistors M11 and M12 are not identical in terms of their sizes and threshold voltages. One of the transistors M11 and M12 may be "stronger" than the other meaning that for equal values of Vgs, the stronger transistor will have a larger drain current. For example, one of the transistors M11 and M12 may be stronger than the other because of differences in their threshold voltages (the transistor with a smaller threshold voltage is stronger than the transistor with a larger threshold voltage). The strength difference between transistors M11 and M12 results from manufacturing tolerances and is generally unavoidable. As the drain currents of transistors M11 and M12 are a function of the adaptive bias current I_ADAPT.

Because transistors M11 and M12 are not identical, the error amplifier 110 may cause a positive common mode rejection (CMR) feedback or a negative CMR feedback to occur. The strength difference between transistors M11 and M12 affects the magnitude of ERROR signal. If transistor M11 is stronger than transistor M12, as I_ADAPT increases with increase in load current (ILOAD), I_M11 becomes larger than I_M12 and ERROR signal increases. ERROR signal increases in this case, not because of changes in the gate voltages of transistors M11 and M12, but because the adaptive bias current I_ADAPT has increased. Conversely, if transistor M12 is stronger than transistor M11, increases in ILOAD causing increases in I_ADAPT causes I_M12 to become larger than I_M11 thereby causing ERROR to decrease.

Ideally, ERROR is only modulated based on the difference between VOUT and VREF, not also based on I_ADAPT. However, with transistor M11 being stronger or weaker than transistor M12, ERROR is also influenced by the adaptive bias current I_ADAPT as explained above. If the gain of Loop2 is high enough and the relative strengths of transistors M11 and M12 are such that increases in I_ADAPT causes ERROR to decrease, VOUT may be experience sustained oscillation. If ILOAD were to increase, ISENSE will increase thereby causing an increase in I_ADAPT. If transistor M12 is stronger than transistor M11, an increase in I_ADAPT causes ERROR to decrease (described above). A decrease in ERROR causes the Vgs of transistor MP to increase thereby causing ILOAD to further increase. As such, differential input pair of transistors in the error amplifier causes Loop2 to be a positive feedback loop.

The combination of positive feedback and a gain of Loop2 that is high enough causes VOUT to experience oscillation. As such, the gain of Loop2 may be designed so as to have a low enough level to avoid such oscillation. Maintaining the gain of Loop2 at a low enough level to avoid oscillation may be implemented, in part, through the selection of the sense ratio between transistors MP and MS. Designing the error amplifier 110 for a lower gain of Loop2 means that adaptive bias current I_ADAPT will be smaller than otherwise would be the case if the gain was higher. As explained above, a higher bias current is desirable for improved noise performance, transient response, and PSRR.

Figure 3:
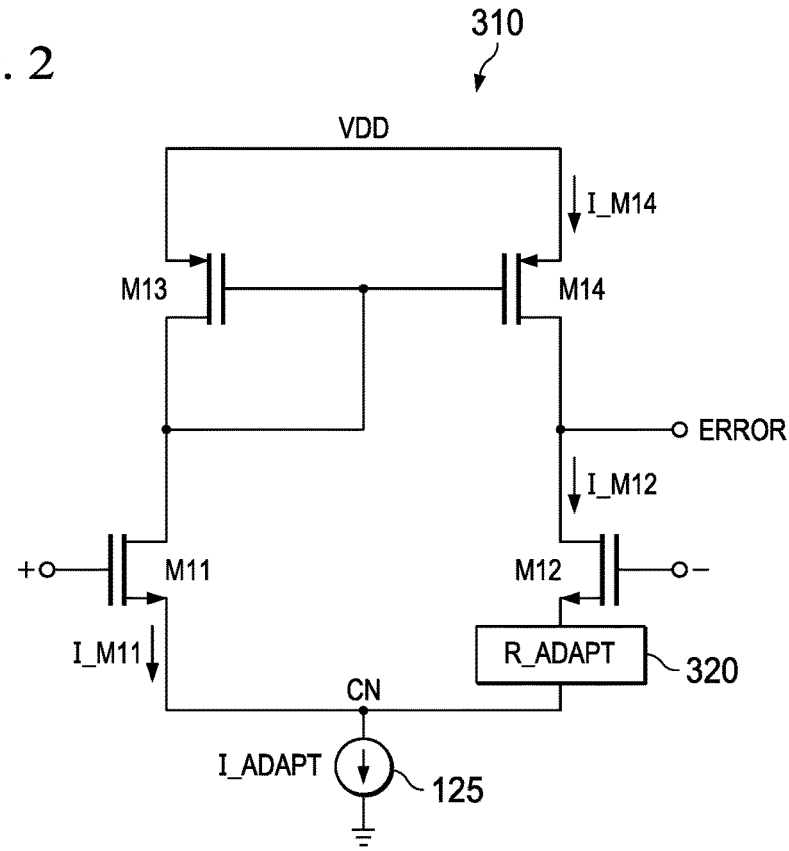
FIG. 3 shows an example implementation of an error amplifier that includes an adaptive resistance circuit.
Figure 4:
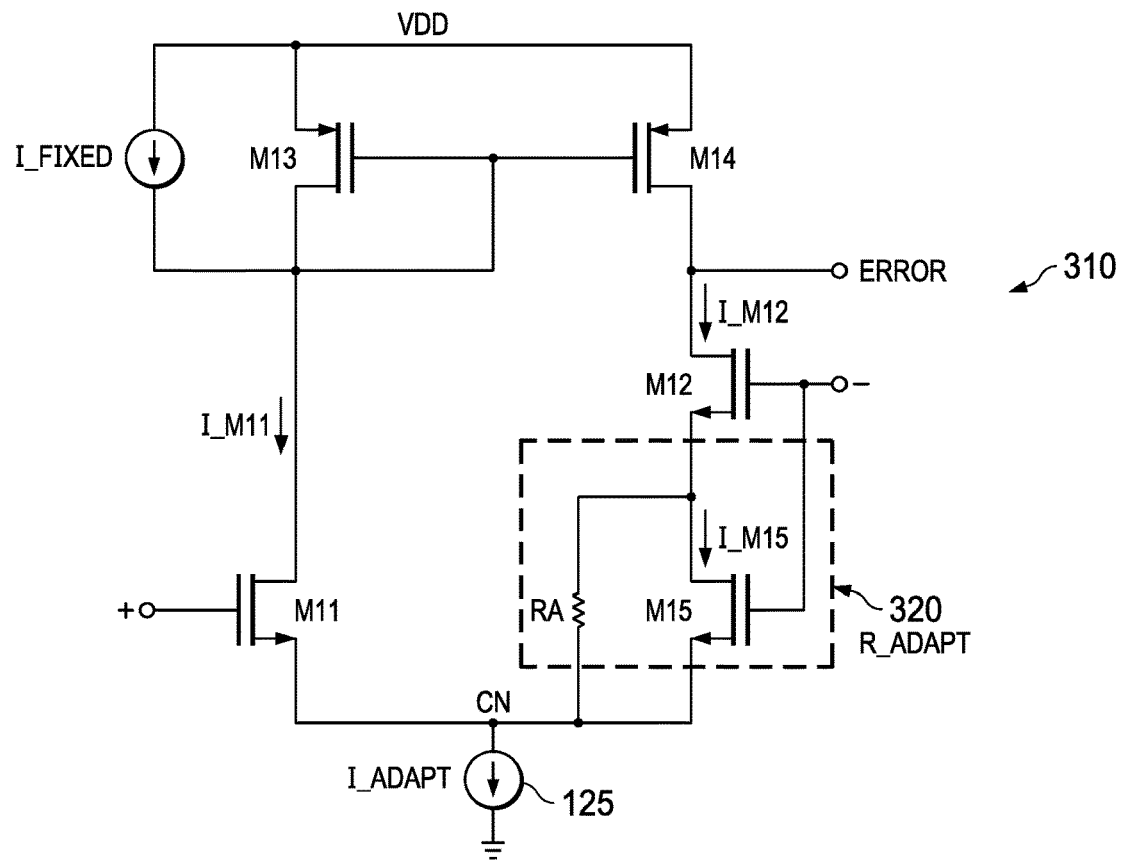
FIG. 4 shows a further example of the error amplifier of FIG. 3 having n-type metal oxide semiconductor field effect transistors as a differential input pair and showing additional detail of the adaptive resistance circuit.
Figure 5:
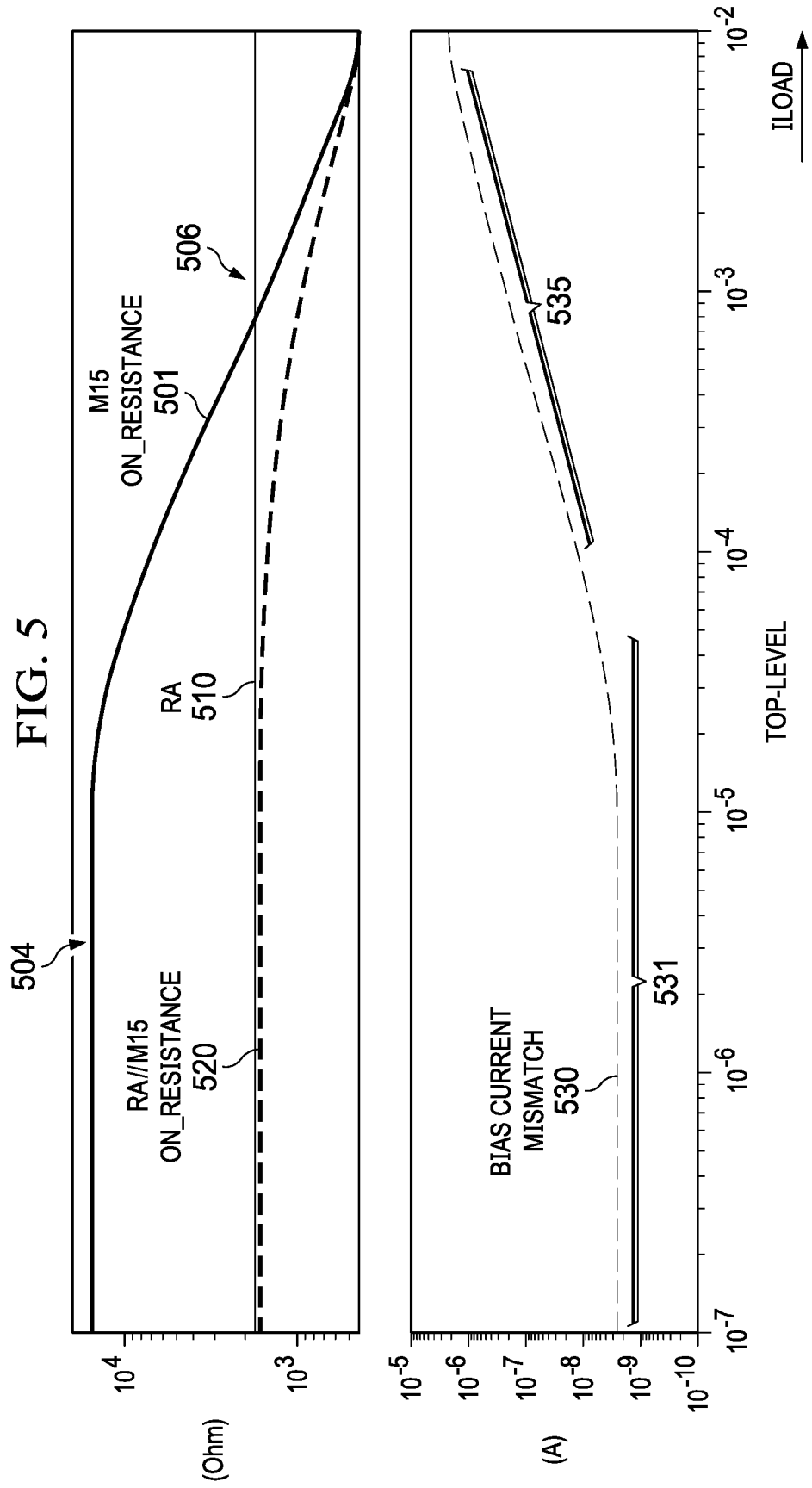
FIG. 5 includes example waveforms illustrating the behavior of the adaptive resistance circuit and its ability to cause a bias current mismatch through the differential input pair.

The embodiments of FIGS. 3-5 show an error amplifier that provides a negative feedback for Loop2 even if manufacturing variations are such that transistor M12 is stronger than transistor M11 (which otherwise would cause a positive feedback to occur). FIG. 3 shows an implementation of an error amplifier 310 that is similar to the implementation of FIG. 2. A difference is that the error amplifier 310 of FIG. 3 includes an adaptive resistance circuit 320 (labeled as R_ADAPT) between the source of transistor M12 and the common node CN. The adaptive resistance circuit 320 introduces an additional resistance in the negative branch of the error amplifier 310 (i.e., the branch including transistor M12 with its gate providing the negative input). The additional resistance of the adaptive resistance circuit 320 ensures that the negative branch is a higher resistance path than the positive branch (through transistor M11). As such, the adaptive bias current I_ADAPT will tend to favor the positive branch over the negative branch. With an increase in I_ADAPT from one current magnitude to a higher current magnitude (referred to as the delta bias current), I_M11 will increase by more than half of the delta bias current with I_M12 thus experiencing a smaller increase than I_M11. With I_M11 experiencing a larger increase than I_M12, I_M14 will be larger than I_M12 thereby causing an increase in ERROR signal. An increase in ERROR signal results in a decrease in the Vgs of transistor MP which in turn reduces the load current ILOAD, and thus Loop2 with error amplifier 310 will be characterized as a negative feedback loop despite the variations in drive strength between transistors M11 and M12 due to manufacturing tolerances. By ensuring that Loop2 is in a negative feedback configuration, the gain of Loop2 can be increased relative to what would have been the case if the error amplifier 110 of FIG. 2 was used in the voltage regulator 100. A technique for increasing the gain of Loop2 is to increase the size of transistor MS relative to transistor MP (a smaller sense ratio). As explained above, a larger value of gain for Loop2 permits a higher level of bias current for lower levels of load current.

FIG. 4 shows further detail regarding the implementation of the error amplifier 310 of FIG. 3. The adaptive resistance circuit 320 in this example includes a resistor RA coupled to a transistor M15. Transistor M15 is an NMOS transistor. One terminal of resistor RA is coupled to the drain of transistor M15 and the other terminal of RA is coupled to the source of M15. RA is coupled in parallel with transistor M15. The gate of transistor M15 is coupled to the gate of transistor M12. The drain of transistor M15 is coupled to the source of transistor M12. The Vds of transistor M15 is low enough that transistor M15 operates in the linear region. In the linear region, transistor M15 has an on-resistance between its drain and source that is generally a function of its Vds divided by its drain current (I_M15). As such, the resistance imposed in the negative branch by transistor M15 is inversely proportional to I_ADAPT. At high levels of I_ADAPT, the on-resistance of transistor M15 is relatively small, and at low levels of I_ADAPT, the on-resistance of transistor M15 is larger.

The relationship between the on-resistance of transistor M15 and load current ILOAD is shown in FIG. 5 at curve 501. At low levels of ILOAD, the on-resistance for transistor M15 is higher (as indicated at 504) than at higher levels of ILOAD (as indicated at 506). While the purpose of the adaptive resistance circuit 320 is to introduce an extra resistance between the source of transistor M12 and CN, the additional resistance undesirably causes the output voltage (ERROR signal) to be increased beyond what would have been the case absent the adaptive resistance circuit 320. The magnitude of ERROR signal is increased by the voltage drop across the adaptive resistance circuit 320. Ignoring the impact of resistor RA for the moment, at higher levels of ILOAD, the on-resistance of transistor M15 is lower and thus the offset on ERROR signal caused by the voltage drop across the adaptive resistance circuit 320 would be relatively small. At lower levels of ILOAD, the offset on ERROR signal that would be caused by the on-resistance of transistor M15 would be much smaller.

Curve 510 is a flat line and shows the resistance of resistor RA. Curve 520 represents the effective resistance of the parallel combination of resistor RA and the on-resistance of transistor M15. Examining curve 520, at lower levels of ILOAD, the effective resistance of the adaptive resistance circuit 320 is dominated by resistor RA. As ILOAD increases, the effective resistance of the adaptive resistance circuit 320 is increasingly dominated by the falling on-resistance of transistor M15. As such, the resistance of the adaptive resistance circuit 320 is maintained relatively low by RA at lower levels of ILOAD and is also maintained relatively low at higher levels of ILOAD by the on-resistance of transistor M15.

Ignoring the effect of the fixed current source I_FIXED, curve 530 represents the mismatch in bias current between the positive and negative branches due to the resistance of the adaptive resistance circuit 320. Due to the additional resistance in the negative branch of the error amplifier (through transistor M12), more of the adaptive bias current I_ADAPT is steered through the positive branch (through transistor M11). The difference in bias current between the two branches (positive branch current minus negative branch current) is plotted across load current ILOAD as curve 530. At higher levels of ILOAD (see reference numeral 535), the amount of bias current mismatch increases due to the increase in the impedance difference (as viewed from the CN) between the positive branch (M11) and the negative branch (M12). The impedance (as viewed from CN) of the positive branch is $1/(gm1)$ (where gm1 is the transconductance of transistor M11). The impedance (as viewed from CN) of the negative branch is $1/(gm2)+$ (RA∥RON_M12) (where gm2 is the transconductance of transistor M12, RON_M12 is the on-resistance of transistor M15, and "∥" refers to RA and RON_M12 being resistances in parallel). While the impedance of the positive branch (M11) is lower than the impedance of the negative branch (M12) for all levels of load current, the relative difference between the impedances of the two branches is greater at higher levels of load current.

The magnitude of the bias current mismatch at lower levels of ILOAD (identified by reference numeral 531) is relatively low (approximately 2.5 nA in this example). That is, while the intentional current mismatch exists between the positive and negative branches of the error amplifier 310, the amount of current mismatch is relatively small because of the low level of adaptive bias current I_ADAPT. Further, it is possible that the amount of current mismatch at lower levels of ILOAD is so low that the random mismatch between transistors M11 and M12 will overwhelm the current mismatch caused by the adaptive resistance circuit 320 to result in Loop2 having positive feedback.

Figure 6:
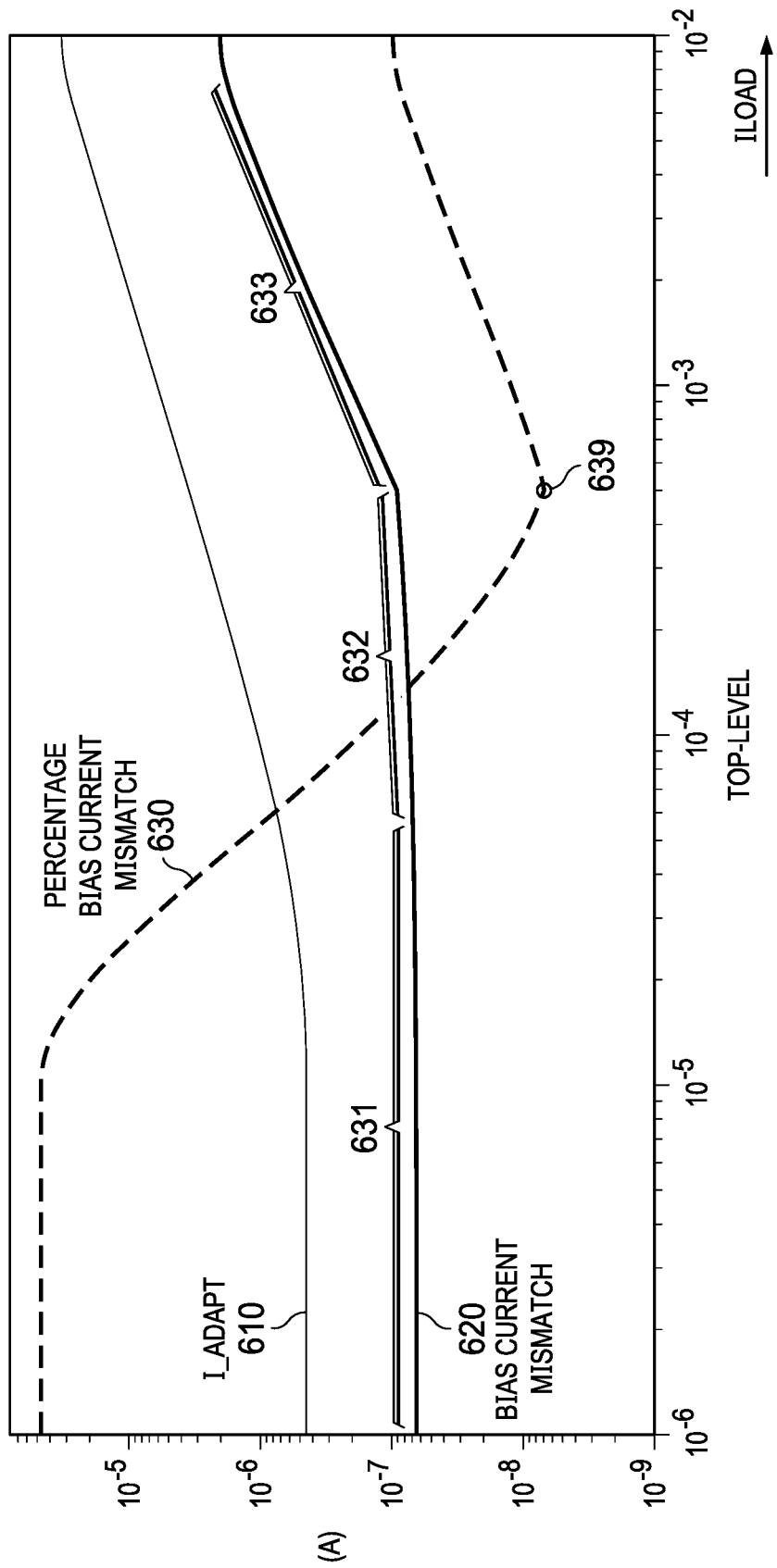
FIG. 6 includes additional waveforms illustrating the influence of the adaptive resistance circuit on the operation of the error amplifier.

The inclusion of the fixed current source, I_FIXED, ensures that the current mismatch between the positive and negative branches is sufficiently high at low levels of ILOAD. Referring to FIG. 4, with the inclusion of fixed current source I_FIXED, the current through transistor M11 (I_M11) is at least I_FIXED. At low levels of ILOAD (and thus low levels of IADAPT), I_M11 remains at least equal to I_FIXED. FIG. 6 includes curves 610, 620, and 630. Curve 610 is an example of I_ADAPT. IADAPT increases as shown as ILOAD increases. Curve 620 is another example of the bias current mismatch between the positive and negative branches of the error amplifier 310 while taking into account the current produced by I_FIXED. At low levels of ILOAD (e.g., at the region 631), the amount of bias current mismatch is approximately 65 nA, which in this example is approximately the magnitude of I_FIXED. That is, at low levels of ILOAD, the bias current mismatch is predominantly set by I_FIXED. At intermediate levels of ILOAD (e.g., region 632), the bias current mismatch is predominantly governed by the resistor RA, and at higher levels of ILOAD (e.g., region 633), the bias current mismatch is predominantly governed by the on-resistance of transistor M15.

Curve 630 in FIG. 6 is the percentage bias current mismatch. Curve 630 is calculated as curve 620 divided by curve 610. The percentage bias current mismatch has a minimum of approximately 2.5% as shown at reference numeral 639. Thus, across a wide spread of ILOAD, the percentage bias current mismatch is equal to or greater than 2.5% in this example.

Figure 7:
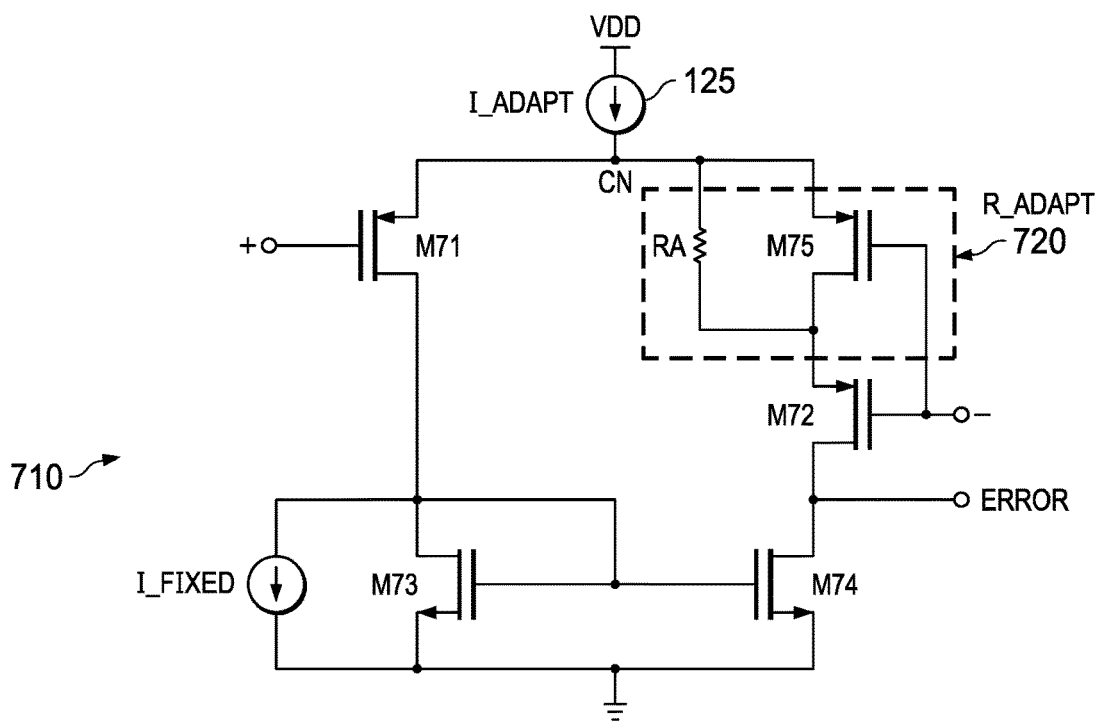
FIG. 7 shows a further example of the error amplifier of FIG. 3 having p-type metal oxide semiconductor field effect transistors as the differential input pair.

FIG. 7 is an example of an error amplifier 710 that includes PMOS transistors M71 and M72 as the differential input pair. Transistors M73 and M74 form the current mirror and are implemented as NMOS transistors. An adaptive resistance circuit 720 is coupled between the source of M72 and CN. The adaptive resistance circuit 720 includes resistor RA coupled in parallel with a PMOS transistor M75. The output of the error amplifier 710 is taken from the drains of M72 and M74. The operation of the error amplifier is largely the same as described above for error amplifier 310.

The examples described herein include metal oxide semiconductor field effect transistors (MOSFETs) which include gates, sources, and drains. The principles described herein, however, can be implemented with other types transistors (e.g., bipolar junction transistors, BJTs). In general, a transistor has a control input and first and first second current terminals. In the example of a MOSFET, the control input is the gate and the first and second current terminals are either of the source and drain. In the example of a BJT, the control input is the base and the first and second current terminals are either of the collector or emitter.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
a first transistor having a control terminal and first and second current terminals, the control terminal of the first transistor being a first input to the circuit;
a second transistor having a control terminal and first and second current terminals, the control terminal of the second transistor being a second input to the circuit, the first and second inputs being differential inputs to the circuit;
an adaptive bias current source circuit coupled to the second current terminal of the first transistor; and
an adaptive resistance circuit coupled between the second current terminal of the second transistor and the adaptive bias current source circuit, the adaptive resistance circuit includes a third transistor having a control terminal coupled to the control terminal of the second transistor, a first current terminal coupled to the second current terminal of the second transistor, and having a second current terminal.

2. The circuit of claim 1, wherein the adaptive resistance circuit comprises a resistor coupled to the first and second current terminals of the third transistor.

3. The circuit of claim 2, further comprising:
a fourth transistor having first and second current terminals, the second current terminal of the fourth transistor coupled to the first current terminal of the first transistor; and
a second current source coupled the first and second current terminals of the fourth transistor.

4. The circuit of claim 1, wherein the adaptive resistance circuit comprises a resistor and a third transistor, the resistor is coupled in parallel to the third transistor.

5. The circuit of claim 1, wherein a resistance of the adaptive resistance circuit is inversely proportional to a bias current of the adaptive bias current source.

6. The circuit of claim 1, wherein when bias current from the adaptive bias current source is flowing, the adaptive resistance circuit causes more than half of the bias current flows through the first transistor and less than half of the bias current to flow through the second transistor and adaptive resistance circuit.

7. The circuit of claim 6, further including a second current source coupled to the first current terminal of the first transistor, wherein a magnitude of the current through the first transistor is at least a magnitude of current from the second current source.

8. The circuit of claim 1, wherein the circuit is at least a portion of an operational amplifier, and the operational amplifier is a component of a voltage regulator.

9. A circuit, comprising:
- a first transistor having a control terminal and first and second current terminals, the control terminal of the first transistor being a first input to the circuit;
- a second transistor having a control terminal and first and second current terminals, the control terminal of the second transistor being a second input to the circuit, the first and second inputs being differential inputs to the circuit;
- a current mirror including third and fourth transistors, the third transistor is coupled to the first transistor, and the fourth transistor is coupled to the second transistor;
- a current source coupled in parallel with the third transistor; and
- a resistance circuit coupled between the second current terminal of the second transistor and the second current terminal of the first transistor, wherein the resistance circuit is configured to force more than half of a bias current through first transistor and less than half of the bias current through the second transistor.

10. The circuit of claim 9, wherein the resistance circuit includes a resistor and a fifth transistor, the resistor is coupled in parallel with the fifth transistor.

11. The circuit of claim 10, wherein the fifth transistor includes a control input and first and second current terminals, the control inputs of the second and fifth transistors are coupled together, and the first current terminal of the fifth transistor is coupled to the second current terminal of the second transistor, and the resistor is coupled to the first and second current terminals of the fifth transistor.

12. The circuit of claim 10, wherein, when on, the fifth transistor operates in a linear region of operation.

13. The circuit of claim 9, wherein a resistance of the resistance circuit is inversely proportional to that portion of the bias current that flows through the second transistor.

* * * * *